US006574256B1

(12) United States Patent
Hofstetter et al.

(10) Patent No.: US 6,574,256 B1
(45) Date of Patent: Jun. 3, 2003

(54) DISTRIBUTED FEEDBACK LASER FABRICATED BY LATERAL OVERGROWTH OF AN ACTIVE REGION

(75) Inventors: Daniel Hofstetter, Neuchatel (CH); Thomas L. Paoli, Los Altos, CA (US); Linda T. Romano, Sunnyvale, CA (US); Decai Sun, Sunnyvale, CA (US); David P. Bour, Cupertino, CA (US); Michael A. Kneissl, Mountain View, CA (US); Chris G. Van de Walle, Sunnyvale, CA (US); Noble M. Johnson, Menlo Park, CA (US)

(73) Assignee: Xerox Corporation, Stamford, CT (US)

( * ) Notice: Subject to any disclaimer, the term of this patent is extended or adjusted under 35 U.S.C. 154(b) by 0 days.

(21) Appl. No.: 09/487,409

(22) Filed: Jan. 18, 2000

(51) Int. Cl.$^7$ .............................. H01S 5/00; H01S 3/08
(52) U.S. Cl. .......................................... 372/45; 372/96
(58) Field of Search ............................ 372/45, 46, 96, 372/50

(56) References Cited

U.S. PATENT DOCUMENTS

| 5,138,625 A | | 8/1992 | Paoli et al. ................... 372/46 |
| 5,208,824 A | * | 5/1993 | Tsang ........................... 372/96 |
| 5,276,702 A | | 1/1994 | Meliga ......................... 372/96 |
| 5,363,399 A | * | 11/1994 | Yagi .............................. 372/96 |
| 5,452,318 A | * | 9/1995 | Makino et al. ............... 372/96 |
| 5,509,024 A | * | 4/1996 | Bour et al. ................... 372/45 |
| 5,852,625 A | | 12/1998 | Takahashi ..................... 372/96 |
| 5,987,048 A | | 11/1999 | Ishikawa et al. ............. 372/46 |

FOREIGN PATENT DOCUMENTS

| JP | 08-195530 A | * | 7/1996 | ............. H01S/3/18 |
| JP | 09-191153 A | * | 7/1997 | ............. H01S/3/18 |
| JP | 10-163577 A | * | 6/1998 | ............. H01S/3/18 |
| JP | 11-274642 A | * | 10/1999 | ............. H01S/3/18 |

OTHER PUBLICATIONS

GaN, AIN, and InN; A review By: Strite, et al.; J. Vac. Sci. Technol. B 10(4), Jul./Aug. 1992, pp. 1237–1266.
Partly Gain–Coupled 1.55 μm Strained–Layer Multiquantum–Well DFB Lasers By: Li, et al.; IEEE Journal of Quantum Electronics, vol. 29 No. 6 Jun. 1993, pp. 1736–1742.
Demonstration of an electrically injected InGaN/GaN MQW DFB laser using holographically defined $3^{rd}$ order gratings By: Hofstetter, et al.; IEEE Device Research Conference, Jun. 22–24, 1998, Charlottesville, VA.

(List continued on next page.)

Primary Examiner—Quyen Leung
(74) Attorney, Agent, or Firm—Fay, Sharpe, Fagan, Minnich & McKee, LLP

(57) ABSTRACT

A distributed feedback structure includes a substrate material. An active layer has an alloy including at least one of aluminum, gallium, indium, and nitrogen. A first cladding, having an alloy including at least one of the aluminum, the gallium, the indium, and the nitrogen, is on a first side of the active layer. A second cladding, having an alloy including at least one of the aluminum, the gallium, the indium, and the nitrogen, is on a second side of the active layer. Periodic variations of refractive indices in at least one of the first and second claddings provide a distributed optical feedback.

8 Claims, 7 Drawing Sheets

OTHER PUBLICATIONS

Characterization of a gain–coupled InGaN/GaN–based optically pumped MQW DFB laser By: Hofstetter, et al.; LEOS '98/Semiconductor Lasers, D. Hofstetter, Jun. 23, 1998.

Lateral epitaxy of low defect density GaN layers via organometallic vapor phase epitaxy By: Nam, et al.; Appl. Phys. Lett. 71 (18), Nov. 3, 1997, ©1997 American Institute of Physics, p. 2638–40.

Room–temperature continuous–wave operations of InGaN multi–quantum–well structure laser diodes with a lifetime of 27 hours By: Nakamura, et al.; Appl. Phys. Lett. 70(11), Mar. 17, 1997, ©1997 American Institute of Physics, p. 1417–1419. 27 hours By: Nakamura, et al.; Appl. Phys. Lett. 70(11), Mar. 17, 1997, ©1997 American Institute of Physics, p. 1417–1419.

Coupled–Wave Theory of Distributed Feedback Lasers By: Kogelnik, et al.; Reflectance and Luminescence of GaAs, (no date available) (p. 2327–2335).

Surface and subsurface imaging of indium in InGaAs by scanning tunneling microscopy By: Pfister, et al.; Applied Surface Science 104/105 (1996) 516–521 (publication month not available).

* cited by examiner

DISTRIBUTED FEEDBACK LASER FABRICATED BY LATERAL OVERGROWTH OF AN ACTIVE REGION

BACKGROUND OF THE INVENTION

The present invention relates to semiconductor structures. It finds particular application in semiconductor laser structures and more particularly to methods of making semiconductor lasers utilizing distributed feedback. It will be appreciated, however, that the invention is also amenable to other like applications.

A semiconductor laser is ordinarily made of Group III–V semiconductor materials. One particularly useful form of such a laser utilizes distributed feedback ("DFB"). In other words, optical feedback is generated along the entire cavity of the laser. For example, such feedback is supplied by means of a DFB diffraction grating whose stripes ("teeth") run perpendicular to the length (longitudinal direction) of the laser cavity. Such lasers, however, tend to suffer from spatial holeburning (spatial variation in optical gain saturation along the longitudinal direction) and from adiabatic chirping. More specifically, they suffer from relatively low gain near the highly reflecting mirror of the laser owing to spatial variation in gain saturation, and from non-symmetrical spectral intensity distribution around the spectral maximum. In turn, such holeburning and chirping cause, among other things, an undesired lack of single mode operation as well as an undesired lack of linearity of laser response to applied signals.

A DFB laser has certain advantages over a Fabry-Perot ("FP") cavity edge-emitting laser. First, the emission wavelength of the DFB laser is selected by the period of the grating near the active region. Second, optically smooth vertical facets are not necessary in the DFB laser structure. Therefore, the end facets of DFB lasers made from some Group III–V materials, e.g. alloys of AlGaN, may be easier to fabricate than FP lasers made from the same materials. FIG. 1 illustrates a GaN laser diode 10 grown on c-face sapphire 12. In general, an FP laser diode 10 includes an n-layer 14 and a p-layer 16. A vertical facet mirror 18 is formed by etching the n-layer 14 and the p-layer to a depth of about two (2) microns. Output beams 22a, 22b are emitted from the mirror 18. A p-contact 24 and an n-contact 26 are electrically connected to the p-layer 16 and the n-layer 14 (through an n-contact layer 28), respectively. Because of the limited etch depth, the output beam 22b is partially refracted into the substrate 12 as a beam 22c and partially reflected as a beam 22d.

Recently, there has been much technical effort focused on InGaN based short wavelength semiconductor lasers. Violet, blue, and green InGaN/AlGaN lasers are expected to be especially useful in applications including printing, displaying, and optically storing data. Although long lifetime violet and blue InGaN laser diodes grown on sapphire substrates (using lateral overgrowth techniques on $SiO_2$ masks) have been realized, major issues regarding defect-free metal organic chemical vapor deposition ("MOCVD") growth of InGaN still exist. Also, the formation of laser mirrors is not nearly as easy and straight-forward as in common red and infra-red ("IR") semiconductor laser materials (e.g., GaAs), in which mirrors are easily formed by cleaving along crystal planes. Lasers grown on a grooved substrate, which suggest the use of DFB rather than Fabry-Perot like cavities, are known. Such grooved substrates result in much easier fabrication of high-quality laser cavities having nearly 100% mirror reflectance.

Index coupled DFB lasers have been fabricated for GaN lasers. However, the threshold current densities required for index coupled GaN lasers are relatively high. Until now, gain coupled DFB GaN lasers have not been realized.

The present invention provides a new and improved apparatus and method, which overcomes the above-referenced problems and others.

SUMMARY OF THE INVENTION

A distributed feedback structure includes a substrate material. An active layer has an alloy including at least one of aluminum, gallium, indium, and nitrogen. A first cladding layer, having an alloy including at least one of the aluminum, the gallium, the indium, and the nitrogen, is on a first side of the active layer. A second cladding, having an alloy including at least one of the aluminum, the gallium, the indium, and the nitrogen, is on a second side of the active layer. Periodic variations in at least one of the first and second claddings provide a distributed optical feedback.

In accordance with one aspect of the invention, the active layer includes an active region quantum sized in one dimension.

In accordance with another aspect of the invention, the periodic variations are created by changes in a thickness in at least one of the first and second claddings.

In accordance with another aspect of the invention, the periodic variations are created by a periodic dielectric grating structure one of below and above the active region.

In accordance with a more limited aspect of the invention, a buffer material is deposited between the substrate material and one of the first and second claddings. A contact material is deposited on the other of the first and second claddings. A first contact is deposited on the contact material. A second contact is deposited on the buffer material. The first contact electrically communicates with the second contact.

In accordance with another aspect of the invention, a tunnel barrier layer is between the active layer and the first cladding.

In accordance with a more limited aspect of the invention, a high-aluminum content, n-type AlGaN:Si layer is deposited on one side of the periodic variations.

In accordance with a more limited aspect of the invention, the first cladding extends into the periodic variations and contacts the second cladding.

In accordance with a more limited aspect of the invention, a barrier layer is between the second cladding and the periodic variations.

In accordance with a more limited aspect of the invention, the periodic variations extend into the second cladding.

One advantage of the present invention is that it combines the advantages of quantum wires, DFB, and stress relief using a single structure. Another advantage of the present invention is that the crystal growth eliminates some problems that are currently major processing issues.

Another advantage of the present invention is that it reduces crack propagation through the active layer, thereby enabling more efficient electron-hole recombination.

Another advantage of the present invention is that it produces GaN lasers that work at relatively short wavelengths (e.g., less than 430 nm) without being cooled to freeze-out leakage.

Still further advantages of the present invention will become apparent to those of ordinary skill in the art upon reading and understanding the following detailed description of the preferred embodiments.

BRIEF DESCRIPTION OF THE DRAWINGS

The invention may take form in various components and arrangements of components, and in various steps and arrangements of steps. The drawings are only for purposes of illustrating a preferred embodiment and are not to be construed as limiting the invention.

DETAILED DESCRIPTION OF THE PREFERRED EMBODIMENTS

Figure 1:
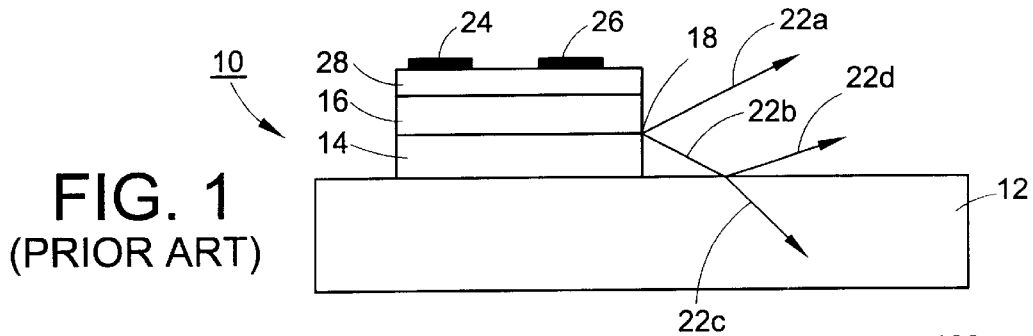
FIG. 1 illustrates a conventional GaN laser diode.
Figure 2:
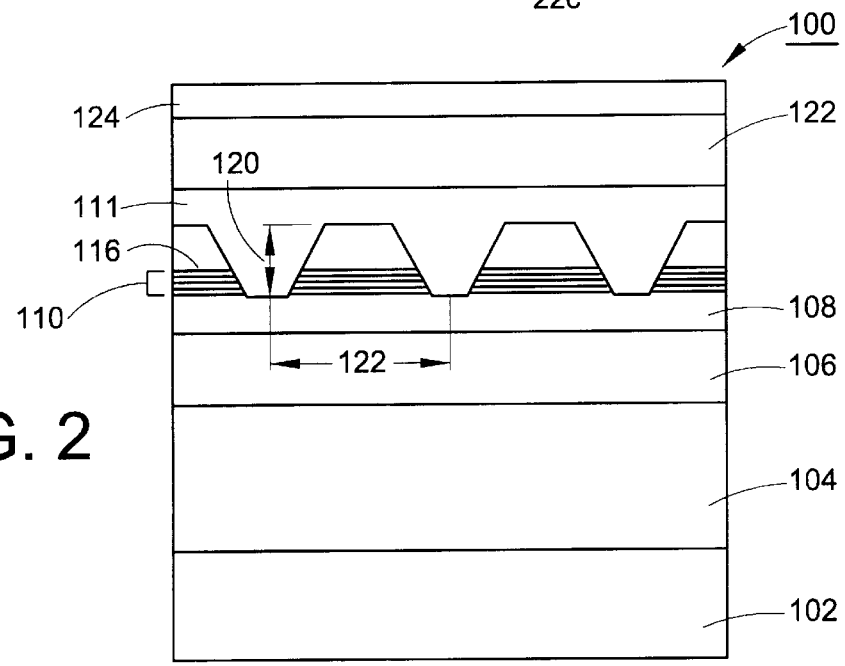
FIG. 2 illustrates a cross-sectional view of a laser diode according to the present invention.
Figure 3:
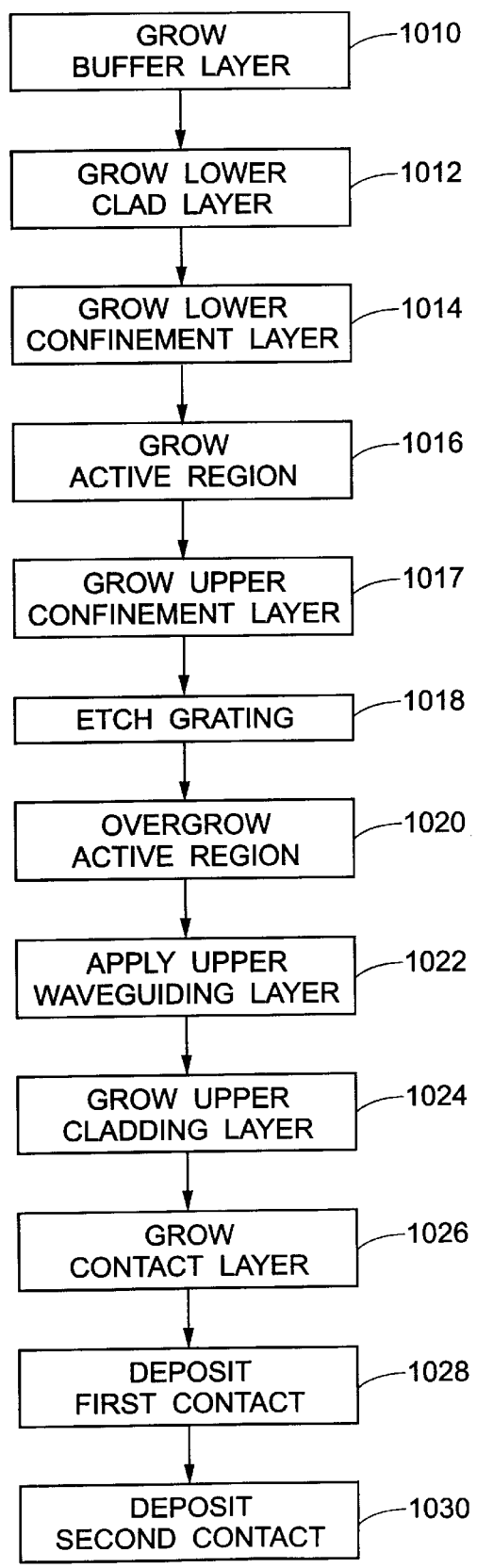
FIG. 3 illustrates a flowchart for manufacturing a laser diode shown in FIGS. 2 and 4.

With reference to FIGS. 2 and 3, a DFB laser 100 includes a substrate 102. Preferably, the substrate 102 is electrically conductive and has a high thermal conductivity (e.g. SiC); however, sapphire is the most widely used substrate material. A buffer layer 104 is epitaxially grown on the substrate 102 in a step 1010. Preferably, the buffer layer 104 is GaN. A lower clad layer 106, preferably AlGaN, is grown on the buffer layer 104 in a step 1012. A lower confinement layer 108 is epitaxially grown on the lower clad layer 106 in a step 1014. The lower confinement layer 108 preferably is GaN and acts as a lower waveguiding layer.

An active region 110, which preferably includes indium, gallium, and nitrogen (e.g., InGaN), is grown on the lower confinement layer 108 in a step 1016. The active region 110 preferably includes multiple layers of $In_xGa_{1-x}N$, which are separated by respective layers of GaN or $In_yGa_{1-y}N$ (where x>y). The thickness of the $In_xGa_{1-x}N$ active layer is preferably sized for achieving quantized confinement in one (1) dimension for electrons and/or holes. A first portion of an upper confinement layer 111 is grown on top of the active layer 110 in a step 1017.

A periodically corrugated grating is etched into the active region 110 in a step 1018 to form grating teeth 116. The teeth 116 are formed by etching entirely through both the first portion of the upper confinement layer 111 and the active region 110. Preferably, the largest width of a grating tooth is sized for achieving quantized confinement in the active region 110. It is to be understood that an aspect ratio, a depth 120, and a period 122 of the grating are chosen to optimize laser performance. For example, an integer multiple of the grating may equal about one-half (½) an emission wavelength of the teeth 116. Preferably, holographic lithography and CAIBE are used to etch the grating through the multiple quantum wells ("MQWs") of the active region. However, other techniques are also possible.

Each of the grating teeth 116 in the periodic array may be viewed as single family of quantum-wires formed by the MQWs. However, because a first order reflection grating has a period of about 80 nm and the size of a conventionally etched tooth is typically about ½ of the period, the dimensions of such a structure are probably too large to observe any benefit of space quantization. In order to attain spatial quantization in the second dimension, it may be necessary to reduce the width of the grating teeth 116 to less than about ½ of the period for a first order reflection grating. In this case, the space between teeth are wider than the teeth and the grating is said to have a duty cycle less than 50%. Alternatively, spatial quantization can be achieved with a grating duty cycle near 50% by fabricating the grating with a period smaller than $1^{st}$ order. In this case, multiple grating teeth will be present within one or more periods of the grating, i.e. $N\lambda_o/2n_e=\Lambda$, where $\lambda_o$ is the wavelength of the light, $n_e$ is the refractive index of the material, N is an integer, and $\Lambda$ is the period 122 of the grating. The fabrication method for the grating teeth 116 is based on electron beam lithography. A grating having a period of about 80 nm and a depth of about 100 nm in GaN and AlGaN is preferred. However, it is to be understood that other periods and depths in other materials are also possible.

Overgrowth of the active region 110 is performed in a step 1020 to fill between and bury the teeth 116 with the upper waveguiding layer 111. Preferably, the teeth 116 are filled with GaN having a thickness of about 50 nm, which is overgrown in step 1022. The upper waveguiding layer is preferably Mg-doped (p-type), but also can be undoped. An upper AlGaN:Mg p-cladding layer 123 is grown in a step 1024. It is to be understood that changes in the thicknesses of at least one of the lower and upper cladding layers 106, 123 provide distributed optical feedback within the laser 100.

A GaN p-contact layer 124 is grown in a step 1026. Because of the efficient DFB mechanism providing almost 100% reflectance and the quantum wire like active region 110, which reduces the current flow, the laser 100 has a very low threshold current density.

Preferably, the grating period 122 is an integer multiple of one-half (½) of the emission wavelength of the quantum wells 116 in the active region 110. Alternatively, the wavelength is an integer multiple of the grating period. In either case, the backward and forward traveling waves in the waveguide formed between layers 106 and 123 are coupled, thereby achieving DFB. When properly designed, the coupling results in very efficient optical feedback, thereby eliminating the need to form smooth vertical mirrors by dry-etching, cleaving or polishing and/or an additional HR coating on the facets of the laser 100.

The periodic variation of the gain due to localization of the active quantum wells 110 within wire-like regions produces very efficient optical coupling even though the grating teeth 116 are buried in material having the same index of refraction. Such gain-coupled DFB lasers are known to be less sensitive to unwanted reflections at the ends of a chip and to exhibit no degeneracy of modes on either side of the spectral stopband.

Figure 4:
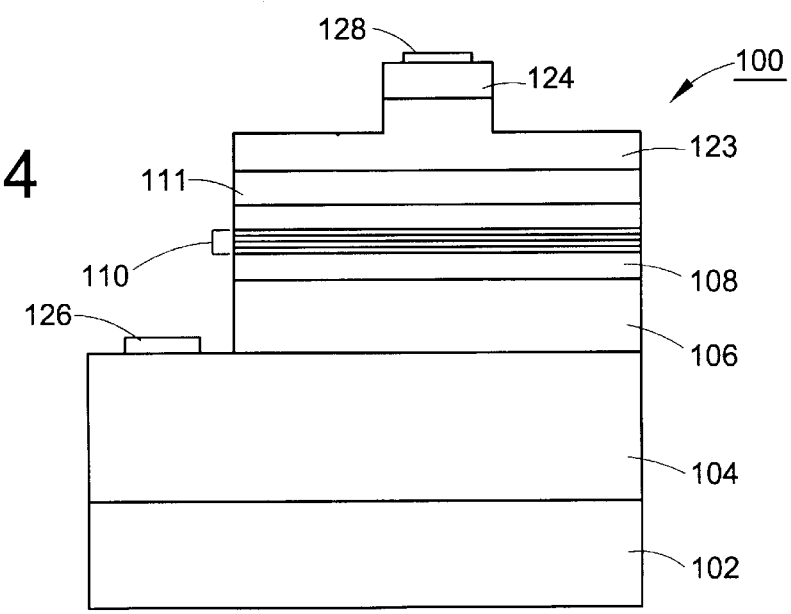
FIG. 4 illustrates a side view of the laser diode shown in FIG. 2.

With reference to FIGS. 3 and 4, the laser 100 is fashioned as a common ridge waveguide structure on top of a wider mesa. A first contact 126 (e.g., an n-contact) is deposited on the buffer layer 104 in a step 1028. Then, a second contact 128 (e.g., a p-contact) is deposited on the cap layer 124 in a step 1030. The first and second contacts 126, 128, respectively, electrically communicate with each other via the buffer layer 104, the lower and upper clad layers 106, 123, respectively, the lower and upper confinement layers 108, 111, respectively, the active region 110, and the cap layer 124.

Figure 5:
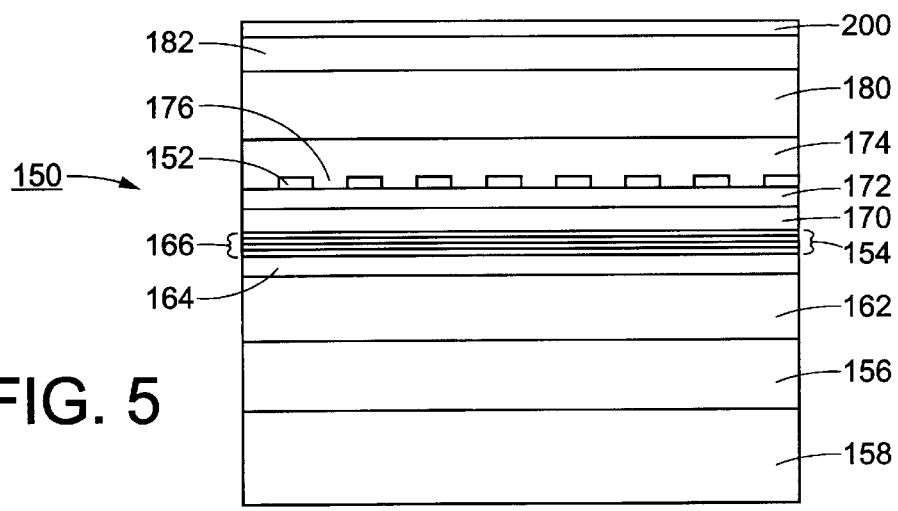
FIG. 5 illustrates a DFB laser according to an alternate embodiment of the present invention.
Figure 7:
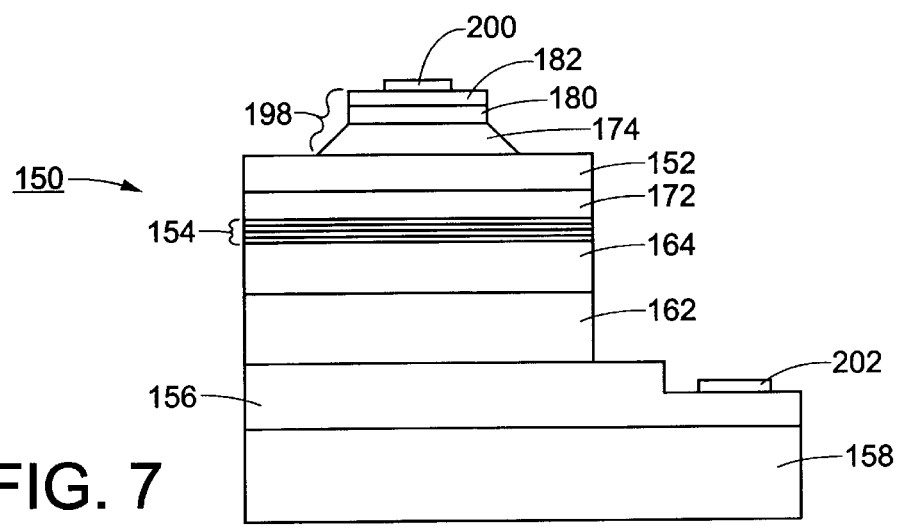
FIG. 7 illustrates a side view of the laser shown in FIG. 5.
Figure 6:
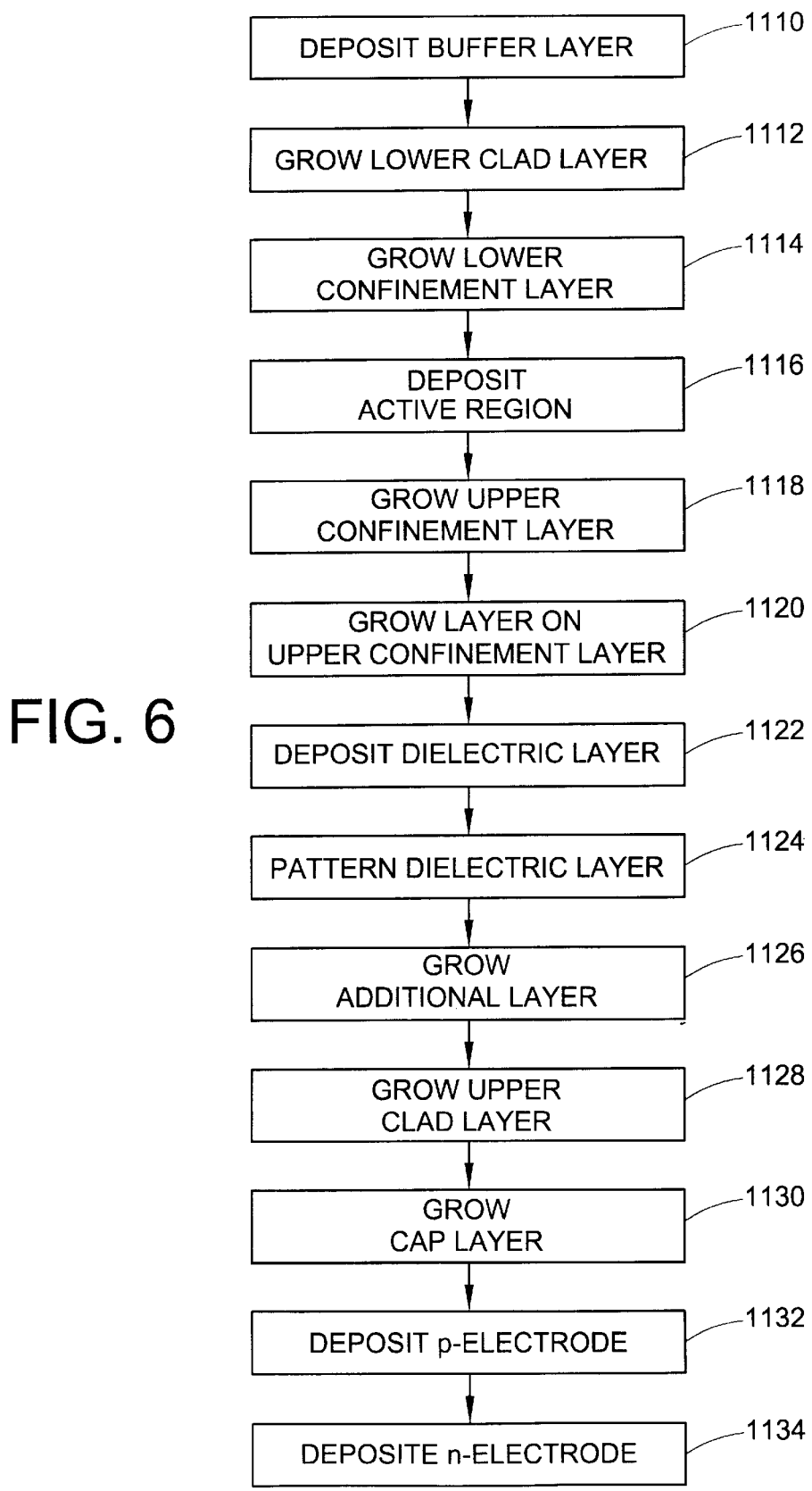
FIG. 6 illustrates a flowchart for manufacturing a laser diode shown in FIGS. 5 and 7.

With reference to FIGS. 5, 6, and 7, a GaN DFB laser 150 includes a grating mask 152 above an active region 154. Preferably, the grating mask 152 includes a dielectric material (e.g., $SiO_2$, $Si_3N_4$, AlN). As in the embodiment shown in FIGS. 2 and 4, a buffer layer 156 (e.g., GaN:Si) is deposited on a substrate layer 158 (e.g., sapphire) in a step 1110. Then, a lower clad layer 162 (e.g., AlGaN:Si) is grown on the buffer layer 156 in a step 1112. A lower confinement layer 164 (e.g., GaN) is grown on the lower clad 162 in a step 1114. The lower confinement layer 164 is preferably undoped. However, it is also contemplated that the lower confinement layer 164 be Si-doped. Then, the active region 154 is deposited on the lower confinement layer 164 in a step 1116. An upper confinement layer 170 (e.g., GaN) is grown on the active region 154 in a step 1118. The upper confinement layer 170 is preferably Mg-doped (p-type), but can also be undoped.

A layer 172 is grown on the upper confinement layer 170 in a step 1120. Preferably, the layer 172 is about 200 nm thick and includes p-GaN. The dielectric layer 152 (e.g., $SiO_2$, $Si_3N_4$, AlN) is deposited on the layer 172 in a step 1122. The dielectric layer 152 is preferably about 50 nm thick. A parallel stripe grating is patterned into the dielectric layer 152 in a step 1124. An additional layer 174 (e.g., GaN:Mg) is grown over the grating 152 in a step 1126. The additional layer 174 first grows in open windows 176 of the dielectric material before laterally extending over the grating 152 of the dielectric material until the grating 152 is covered.

The coalesced additional layer 174 over the dielectric grating 152 is typically smooth with few voids. Preferably, the rms roughness of the grating 152 is about 0.25 nm. After the surface is planarized by the growth of the additional layer 174, an upper clad layer 180 (e.g., AlGaN:Mg) is grown in a step 1128. Then, a cap layer 182 (e.g., GaN:Mg) is grown in a step 1130.

A third order grating design is chosen for achieving a peak wavelength of about 430 nm. Assuming that the refractive index of $SiO_2$ is about 1.5, and the refractive index of GaN is about 2.67 at about 430 nm, the widths of the $SiO_2$ and GaN regions are about 100 nm and about 185 nm, respectively. The grating preferably has a period of about 285 nm. Such narrow $SiO_2$ stripes are typically easy to cover using the lateral growth technique. Therefore, the additional GaN grating layer 174 is not too thick. Because the difference of the refractive indices of $SiO_2$ and GaN is relatively large, large optical feedback is achieved using a short grating length.

The grating is preferably patterned by holography technique or e-beam lithography. Short gratings having a period of about 250 nm on GaN using the holography technique have been demonstrated.

FIG. 7 illustrates a side view of the laser 150 shown in FIG. 5. The additional layer 180, upper clad layer 180, and cap layer 182 form a ridge 198. The ridge 198 is aligned perpendicular to the dielectric layer 152. A p-electrode 200 is deposited on the cap layer 182 in a step 1132. Similarly, an n-electrode 202 is deposited on the buffer layer 156 in a step 1134. The p-electrode 200 and n-electrode 202 electrically communicate with one another. Since the DFB grating provides a high optical feedback for photons along the cavity, no smooth vertical facets are necessary.

Figure 8:
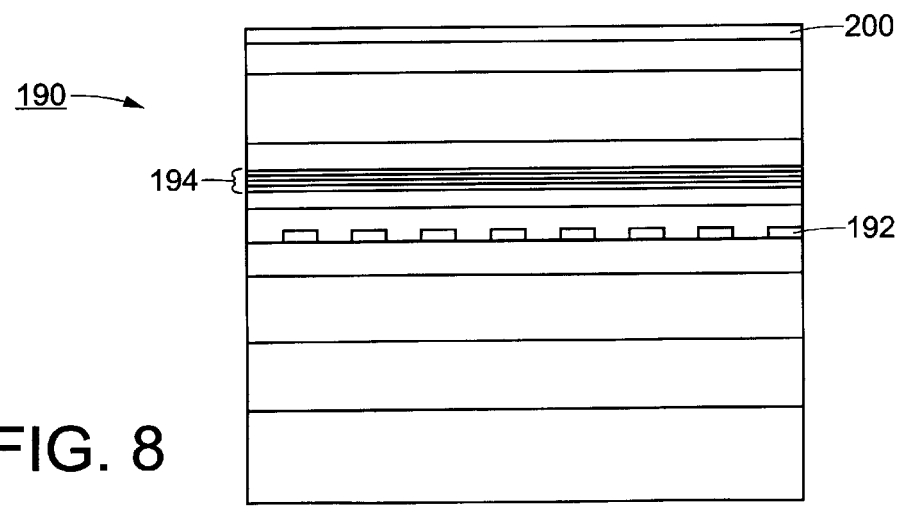
FIG. 8 illustrates a DFB laser according to another alternate embodiment of the present invention.

FIG. 8 illustrates an alternate embodiment to that shown in FIG. 5. More specifically, FIG. 8 illustrates a GaN DFB laser 190 having a grating structure 192 positioned below an active region 194. It is to be understood that the dimensions and materials of the laser 190 are comparable to the laser 150 illustrated in FIG. 5. It is to be understood that the laser 190 is constructed according to methods similar to those used for constructing the laser illustrated in FIG. 5.

In the embodiments shown in FIGS. 2 and 4–8, the InGaN MQW active regions are completely surrounded by GaN. Although the GaN has a higher bandgap energy (e.g., 3.4 eV) than the InGaN active region (about 3.1 eV for a 400 nm laser wavelength), this difference does not provide adequate confinement of injected electrons under some circumstances. More specifically, the energy difference may not provide adequate confinement of injected electrons during the high-injection condition present at lasing threshold. The successful operation of nitride FP laser diodes demands that, in order to confine injected electrons, a p-type, high-aluminum content AlGaN:Si tunnel barrier layer be placed over the MQW. This function is most often accomplished with a 20 nm $Al_{0.2}Ga_{0.8}N$:Mg layer placed immediately over the QWs in the state-of-the-art lasers. Alternatively, this function can also be accomplished with an asymmetric waveguide structure having a p-cladding layer placed immediately over the QWs.

Figure 9A:
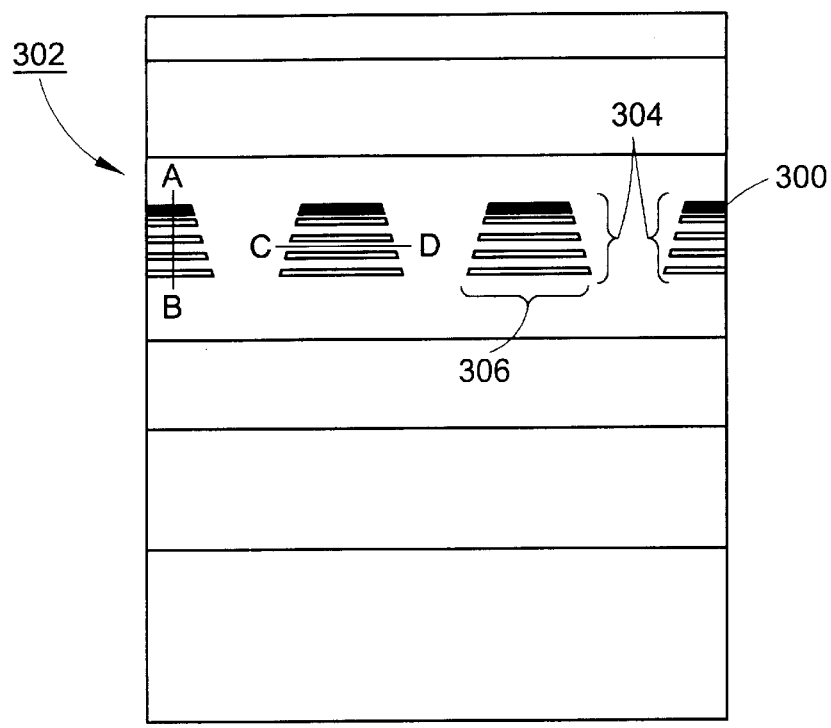
FIG. 9A illustrates a laser diode having a tunnel barrier layer.
Figure 9B:
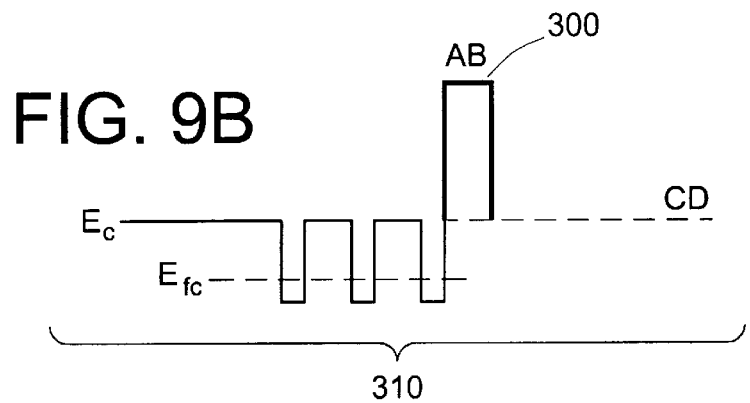
FIGS. 9B and 9C illustrate conduction band diagrams for the laser diode shown in FIG. 9A.
Figure 9C:
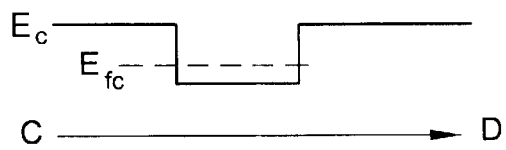

As illustrated in FIGS. 9A, 9B, and 9C simply including an AlGaN:Si tunnel barrier layer 300 (e.g., AlGaN:Mg) in a first epitaxial growth of a laser 302 is not sufficient for confining injected carriers in a nitride DFB laser. More specifically, a conduction band diagram 310 (FIG. 9B) shows that in a direction AB perpendicular to the MQWs the tunnel barrier layer 300 is present. However, the tunnel barrier layer does not exist in a direction CD parallel to the MQWs (as shown in the conduction band 312 in FIG. 9C). Therefore, since the AlGaN:Si layer 300 does not cover MQW sidewalls 304 of grating teeth 306, injected electrons are not confined in the lateral direction and, furthermore, electrons are free to leak out in a lateral direction.

Figure 10:
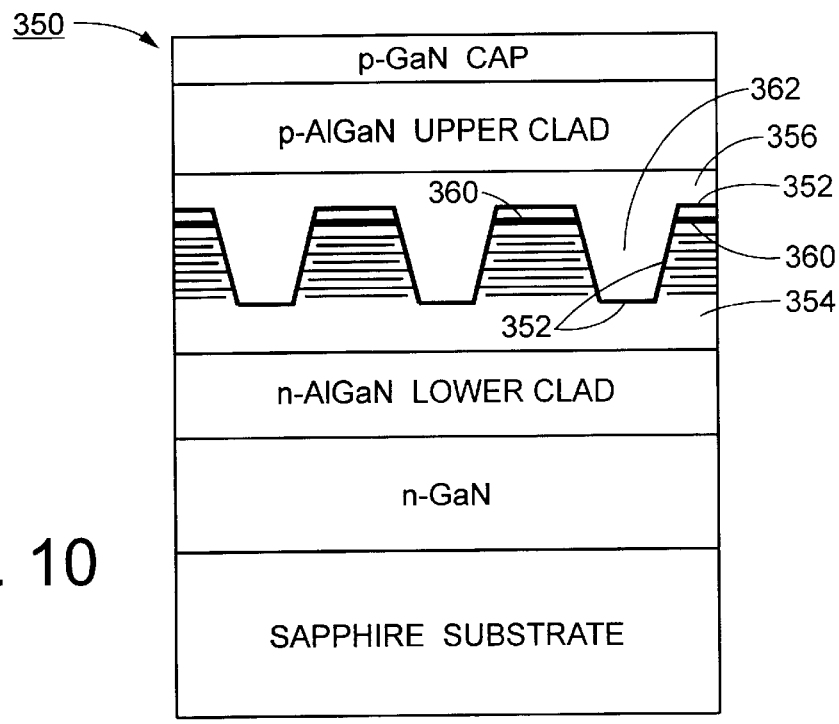
FIG. 10 illustrates a structure in an embodiment of the present invention for increasing the confinement of injected electrons.

FIG. 10 illustrates a structure 350 in an embodiment of the present invention for increasing the confinement of injected electrons. A tunnel barrier 352 exists along the entire pn junction between lower and upper confinement layers 354, 356, respectively. In other words, the tunnel barrier 352 is deposited during the overgrowth. In this embodiment, an additional tunnel barrier 360 is included in the first growth for ensuring that the barrier 352 is close to the top of the QWs and serves as a tunnel barrier for transverse (perpendicular to the quantum well layers) confinement. Note the two (2) tunnel barriers 352, 360 are positioned at the top of wells 362. Alternatively, if the initial growth is stopped immediately above the QWs 362, the additional tunnel barrier may be eliminated, leaving the entire tunnel barrier to be deposited at the beginning of the overgrowth. In this case, because of the very short minority electron diffusion length in highly Mg-doped nitrides, the tunnel barrier is placed in very close proximity to the QWs (i.e., less than about 20 nm).

Figure 11:
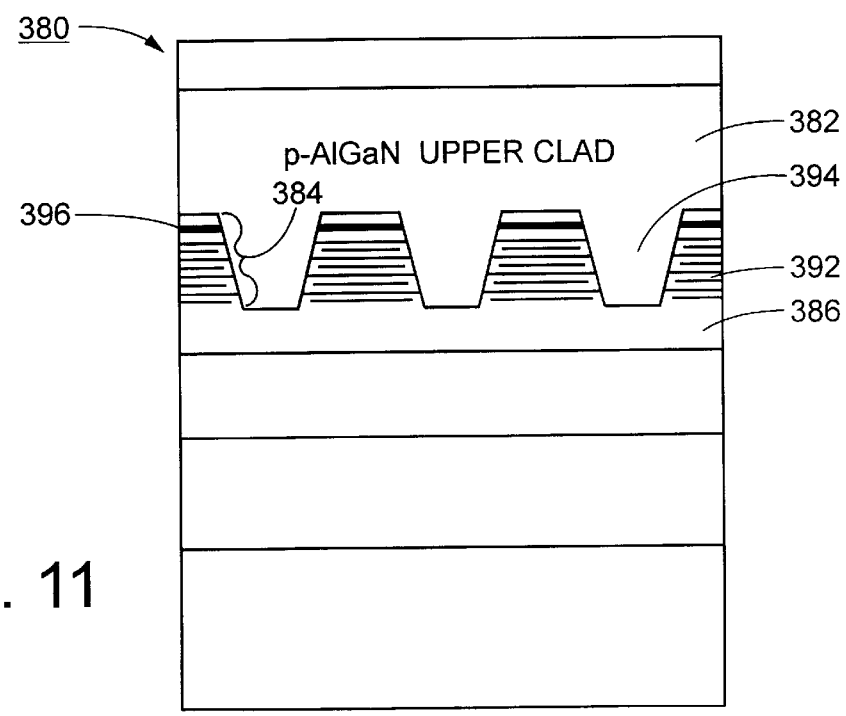
FIG. 11 illustrates an alternate structure for providing electron confinement.

FIG. 11 illustrates an alternative structure 380 for providing electron confinement. The wafer 380 is constructed according to the methods discussed above. However, the regrowth commences with a p-cladding layer 382 (e.g., AlGaN) instead of a remaining upper waveguide. A high bandgap energy and p-type doping of the cladding layer 382 offers sufficient electron confinement along grating tooth sidewalls 384. The wafer 380 is very similar to InGaAsP/InP structures demonstrated at longer wavelengths, in which the InP p-cladding layer is regrown around a grating. In a similar manner, the nitride analogue shown in FIG. 11 also incorporates the p-cladding layer 386 material immediately surrounding the grating 392. The only important distinction is the requirement to keep the high-bandgap material in very close proximity to the QWs 394. Hence, an additional AlGaN:Si tunnel barrier layer 396 is included in the first epitaxy to ensure proper placement relative to the QWs 394. Subsequently, the second growth commences with either the p-cladding layer 382 or the AlGaN:Si tunnel barrier layer shown in FIG. 10.

The wafer 380 shown in FIG. 11, in which the p-cladding 382 is grown around the grating 392, offers a further advantage. More specifically, the p-AlGaN cladding layer 382 is grown thick, and the AlGaN is known to planarize quickly. The tendency to planarize has been observed in cross-sectional scanning electron micrographs of layers that cracked during growth. Therefore, because the upper surface of the first regrown layer is both more smooth and further removed from the regrowth interface (the AlGaN:Mg is typically grown about 500 nm), any remnant roughness from the grating surface is relatively unimportant. On the other hand, if the regrowth commences with a p-type GaN waveguide having about 100 nm thickness, it is possible that the next optical surface suffers from some residual texture. Therefore, in contrast to the ideal, planar growth illustrated in FIG. 10, the p-AlGaN cladding is deposited on a somewhat non-planar surface.

Figure 12:
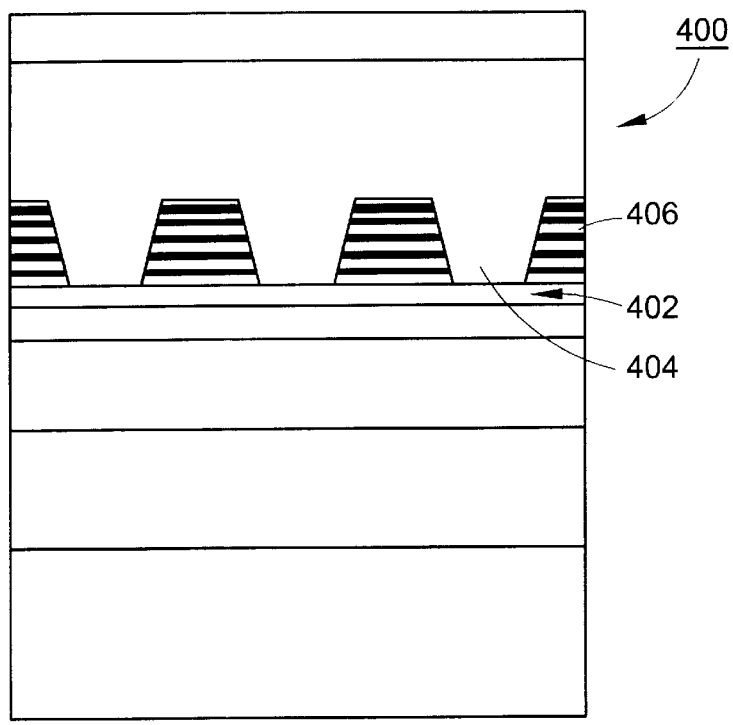
FIG. 12 illustrates a structure for reducing leakage current, which results from injection across an AlGaN:Mg/GaN:Si regrowth interface between grating teeth at a bottom of an etched region.
Figure 13:
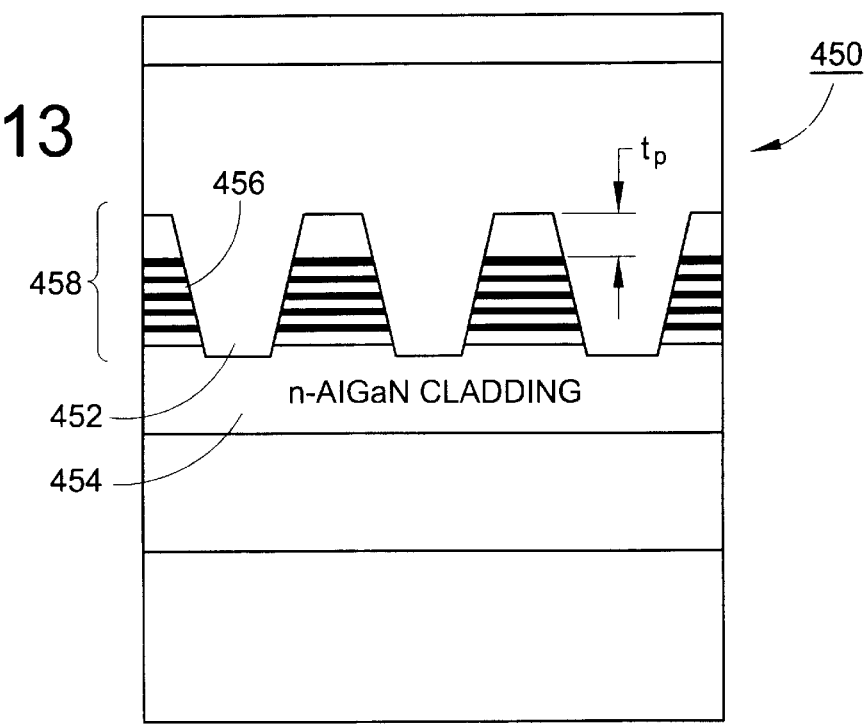
FIG. 13 illustrates another structure for reducing leakage current, which results from injection across an AlGaN:Mg/GaN:Si regrowth interface between grating teeth at a bottom of an etched region.

FIGS. 12 and 13 illustrate preferred structures 400, 450, respectively, for reducing leakage current, which results from injection across the AlGaN:Mg/GaN:Si regrowth interface between grating teeth at the bottom of an etched region in the structure of FIG. 11. For the structure of FIG. 11 the turn-on voltage of the junction is only about 300 meV greater than that of the regrown AlGaN:Mg/InGaN junction, which injects carriers into the QWs. This small turn-on voltage difference is considered not sufficient for suppressing injection of carriers into the n-waveguide rather than the QWs.

With reference to FIG. 12, a high-aluminum content, n-type AlGaN:Si layer 402 is deposited below QWs 404. If grating teeth 406 are etched down to the AlGaN:Si layer 402, AlGaN:Mg regrowth over the AlGaN:Si layer 402 forms a pn junction having a significantly higher turn-on voltage. Therefore, the QWs 404 are preferentially injected during forward bias.

Alternatively, with reference to FIG. 13, the wafer 450 is an inverted asymmetric waveguide structure, having MQWs 452 adjacent to an n-cladding layer 454, rather than a p-cladding layer. A p-waveguide thickness $t_p$ is optimized for maximum optical confinement. Grating teeth 456 are etched into an n-AlGaN waveguide 458. Therefore, the pn junction formed by the AlGaN:Mg overgrowth has a greater turn-on voltage relative to the regrowth on the n-GaN surface of FIG. 11.

The invention has been described with reference to the preferred embodiment. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiment, the invention is now claimed to be:

1. A distributed feedback laser, comprising:

a substrate material;

an active layer having an alloy of gallium nitride;

a first waveguiding layer, including gallium nitride or an alloy of gallium nitride, including at least one of aluminum and indium, on a first side of the active layer;

a first cladding, including gallium nitride or an alloy of gallium nitride, including at least one of aluminum and indium, on a second side of the first waveguiding layer;

a second waveguiding layer, including gallium nitride or an alloy of gallium nitride, including at least one of aluminum and indium, on a second side of the active layer;

a tunnel barrier layer between the active layer and at least one of the waveguiding layers with the active layer and the tunnel barrier layer being periodically corrugated to form a periodic grating for providing distributed optical feedback;

a second cladding, including gallium nitride or an alloy of gallium nitride including at least one of aluminum, and indium, on a second side of the waveguiding layer.

2. The distributed feedback laser as set forth in claim 1, wherein the period of the grating is proportional to an integer number of half-wavelengths of a light.

3. The distributed feedback laser as set forth in claim 1, further including a contiguous second tunnel barrier layer between the periodically corrugated active layer and the second waveguiding layer.

4. The distributed feedback laser as set forth in claim 1, wherein the active layer includes at least one active region quantum sized in one dimension.

5. A distributed feedback laser, comprising:

a substrate material;

an active layer having an alloy of gallium nitride;

a waveguiding layer, including gallium nitride or an alloy of gallium nitride, including at least one of aluminum and indium, on a first side of the active layer;

a tunnel barrier layer on the second side of the active layer with the active layer and the tunnel barrier layer being periodically corrugated to form a periodic grating for providing distributed optical feedback;

a first cladding, including gallium nitride or an alloy of gallium nitride, including at least one of aluminum and indium, on a second side of the waveguiding layer; and a second cladding, including gallium nitride or an alloy of gallium nitride, including at least one of aluminum and indium, on a side of the tunnel barrier layer.

6. The distributed feedback laser as set forth in claim 5, wherein the period of the grating is proportional to an integer number of half-wavelengths of a light.

7. The distributed feedback laser as set forth in claim 5, further including a contiguous second tunnel barrier layer between the periodically corrugated active layer and the waveguiding layer.

8. The distributed feedback laser as set forth in claim 5, wherein the active layer includes at least one active region quantum sized in one dimension.

* * * * *